Figure 1:
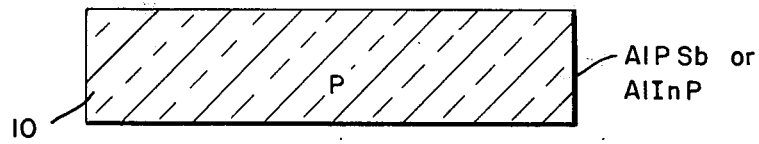

United States Patent [19]

Kamath

[11] 4,156,310
[45] May 29, 1979

[54] HIGH BANDGAP WINDOW LAYER FOR GAAS SOLAR CELLS AND FABRICATION PROCESS THEREFOR

[75] Inventor: G. Sanjiv Kamath, Malibu, Calif.

[73] Assignee: Hughes Aircraft Company, Culver City, Calif.

[21] Appl. No.: 887,692

[22] Filed: Mar. 17, 1978

Related U.S. Application Data

[62] Division of Ser. No. 792,840, May 2, 1977, Pat. No. 4,107,723.

[51] Int. Cl.² ............................................. B01J 17/00
[52] U.S. Cl. .................................. 29/572; 136/89 GA
[58] Field of Search ....................... 29/572; 357/16, 30; 136/89 GA

[56] References Cited

U.S. PATENT DOCUMENTS

| | | | |
|---|---|---|---|
| 2,929,859 | 3/1960 | Loferski | 357/16 |
| 3,960,620 | 6/1976 | Ettenberg | 357/30 |
| 3,993,506 | 11/1976 | Moon | 357/30 |
| 4,017,332 | 4/1977 | James | 357/16 |

Primary Examiner—W. Tupman
Attorney, Agent, or Firm—William J. Bethurum; W. H. MacAllister

[57] ABSTRACT

The specification describes a semiconductor solar cell and fabrication process therefor wherein a thin N-type gallium arsenide layer is deposited on a larger P-type substrate layer which is selected from the group of III-V ternary compounds consisting of aluminum phosphide antimonide, AlPSb, and aluminum indium phosphide, AlInP. P-type impurities are diffused from the substrate layer into a portion of the thin N-type gallium arsenide layer to form P-type region therein which defines a PN junction in the thin gallium arsenide layer. Thus, the quantity of gallium arsenide required to provide this PN photovoltaic junction layer in the cell is minimized, and the P-type substrate serves as a high bandgap window layer for the cell. Such high bandgap of this window material is especially well suited for efficiently transmitting the blue spectrum of sunlight to the PN junction, thus enhancing the power conversion efficiency of the solar cell.

3 Claims, 4 Drawing Figures

U.S. Patent  May 29, 1979  4,156,310

HIGH BANDGAP WINDOW LAYER FOR GAAS SOLAR CELLS AND FABRICATION PROCESS THEREFOR

This is a division of application Ser. No. 792,840, filed May 2, 1977, now U.S. Pat. No. 4,107,723.

FIELD OF THE INVENTION

This invention relates generally to gallium arsenide solar cells and more particularly to such solar cells which are relatively inexpensive in cost and which exhibit an improved power conversion efficiency.

BACKGROUND

Substantial efforts have been made in recent years toward improving the efficiency and yields of semiconductor solar cells and reducing their production costs. As compared to silicon, gallium arsenide has long been recognized as a material with a bandgap more favorable for maximizing solar cell efficiency and also a material better suited for operation at elevated temperatures. Additionally, because of the small optical absorption depth in direct transistion semiconductors like gallium arsenide, short minority carrier diffusion lengths can be tolerated, and this leads to better resistance to radiation damage.

One state-of-the-art type of gallium arsenide solar cell which has evolved as a result of continuing efforts in solar cell research is a gallium arsenide solar cell comprising an N-type galium arsenide substrate upon which a P-type layer of gallium aluminium arsenide is epitaxially deposited. One such structure is shown, for example, in an article by J. DuBow in *Electronics*, Vol. 49, No. 23, Nov. 11, 1976 at page 89. Another such structure is disclosed by H. J. Hovel et al in an article entitled "$Ga_{1-x}Al_xAs$ - PPN Heterojunction Solar Cells", *Journal of the Electrochemical Society*, September 1973 at pages 1246–1252, and both of these articles are incorporated herein by reference. Yet another such solar cell structure is disclosed in a copending application of Sanjiv Kameth et al, Ser. No. 792,839 assigned to the present assignee.

While the above type of gallium arsenide-gallium aluminum arsenide solar cell has proven to be a relatively efficient device and generally satisfactory in several respects, it nevertheless requires a relatively thick bulk gallium arsenide substrate starting material for its manufacture. This requirement is partially responsible for the expensive manufacturing cost for these solar cells as a result of the high cost of gallium. However, it is well known that major efforts are continually being made in both silicon and gallium arsenide solar cell research to reduce solar cell manufacturing costs by providing high yield and large volume manufacturing processes for economically making these solar cells.

In addition to the above efforts to reduce solar cell costs, there are also continuing efforts to increase the power conversion efficiency of these cells. In this regard, it has been observed that the gallium aluminum arsenide window material of the above state-of-the-art type gallium arsenide-gallium aluminum arsenide solar cell is somewhat limited in its transmission of the blue spectrum of sunlight. This, of course, is a limiting factor as regards the maximum attainable efficiency for these cells as well as the ultimate cost reduction of large scale solar cell arrays.

THE INVENTION

Accordingly, the general purpose of this invention is to provide a new and improved gallium arsenide solar cell and fabrication process therefor which process not only greatly reduces the gallium quantity requirement in solar cell manufacture, but at the same time improves the transmission of the blue spectrum of sunlight in the resultant solar cell relative to the above described prior art gallium arsenide-gallium aluminum arsenide cells. These features thus enhance solar cell efficiency while simultaneously reducing their production costs.

To accomplish this purpose, I initially provide a P-type substrate material selected from the group of ternary III-V compound semiconductors consisting of aluminum phosphide antimonide and aluminum indium phosphide. This substrate is then exposed to an epitaxial deposition process wherein a thin uniform N-type layer of gallium arsenide is grown to a predetermined thickness, typically on the order of about 1 micrometer. During this epitaxial growth step, a P-type impurity (e.g. aluminum) in the substrate diffuses into a portion of the thin N-type epitaxial layer to convert the conductivity of that portion to P-type and thus form the required photovoltaic PN junction for the cell. Finally, state-of-the-art metallization deposition and anti-reflective coating film deposition techniques are used to provide the necessary front and back contact metallization for extraction power from the device and also the necessary anti-reflection coating on the P-type window layer thereof. The window layer for this device is, of course, the P-type substrate instead of an epitaxial layer as in prior art devices.

Thus, it will be readily appreciated that the requirement for the expensive element gallium has been substantially reduced to only that required to form a thin epitaxial gallium arsenide layer, typically of one to five micrometers in thickness, instead of a much thicker gallium arsenide substrate, typically of two hundred micrometers or more. Simultaneously, the utilization of the above P-type substrate window material having a higher band-gap energy than gallium aluminum arsenide substantially improves the power conversion efficiency of the solar cell by improving the transmission of the blue spectrum of sunlight to the device's PN junction.

Therefore, it is an object of the present invention to provide a new and improved gallium arsenide solar cell and fabrication process therefor.

Another object is to provide a gallium arsenide solar cell of the type described having an improved power conversion efficiency relative to known state-of-the-art gallium arsenide solar cells.

Another object is to provide a solar cell of the type described which may be mass produced at substantially less manufacturing cost than those state-of-the-art solar cells utilizing a gallium arsenide substrate as the process starting material.

A feature of the present invention is the provision of a gallium arsenide solar cell of the type described which exhibits a good crystal lattice match between the various layers that make up the cell.

Another feature of the invention is the provision of an improved solar cell having a window material with a wide bandgap which permits good transmission of the blue spectrum of sunlight to the device's PN junction.

Another feature is the provision of a process for making gallium arsenide solar cells which requires an absolute minimum of the expensive element gallium in the fabrication of these solar cells.

These and other objects and features of the invention will become more readily apparent in the following description of a preferred embodiment of the invention.

DRAWINGS

Figure 2:
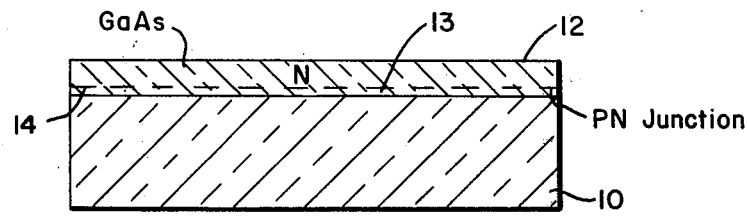
Figure 3:
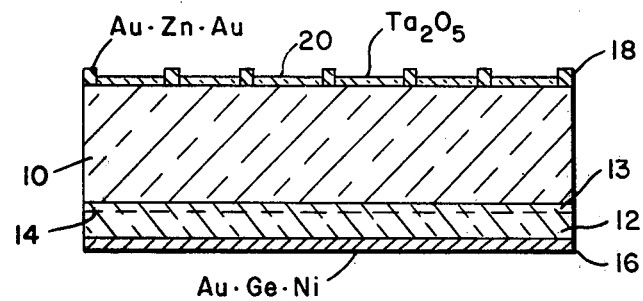
Figure 4:
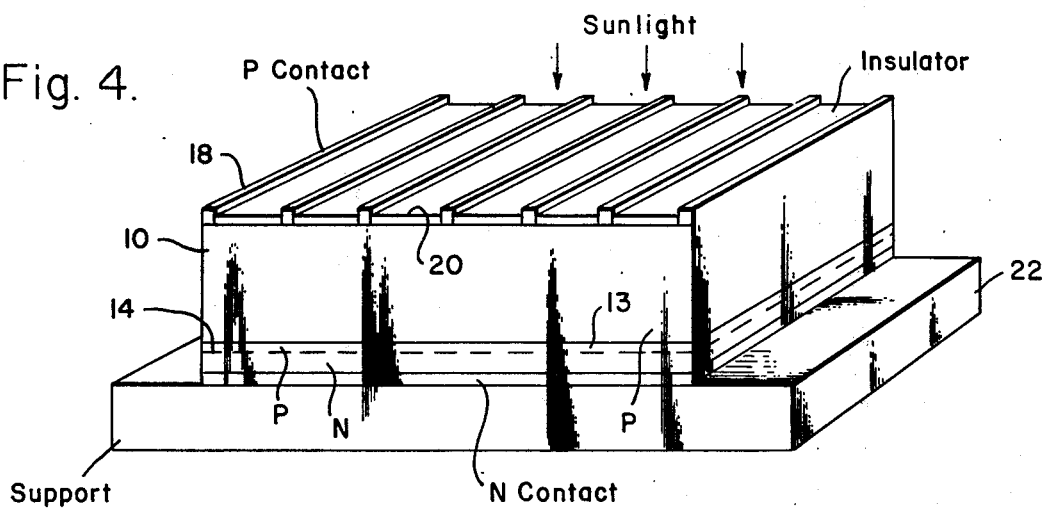

FIGS. 1, 2, and 3 illustrate schematically a preferred processing sequence for practicing the invention; and FIG. 4 is an isometric view of the completed solar cell structure of FIG. 3.

Referring now to the drawings, there is shown in FIG. 1 a P-type substrate starting material 10 which preferably consists of either aluminum phosphide antimonide or aluminum indium phosphide and which is appropriately doped with a P-type impurity such as Be or Ge. The substrate 10 will typically be on the order of 200-250 micrometers in thickness and has a large band gap greater than 2 electron volts to provide good light transmission to the PN junction of the solar cell. Additionally, the composition of the P-type substrate 10 will be adjusted to provide a good crystal lattice match for the thin epitaxial layer 12 of N-type gallium arsenide which is deposited on the upper surface of the substrate 10 as shown in FIG. 2.

Preferably, this epitaxial deposition process used to form the thin N-type layer 12 is carried out using the vertical graphite slide bar and saturated solution growth LPE techniques which are described in allowed copending application Ser. No. 717,806 by Sanjiv Kamath et al entitled "Method for Growing Thin Semiconductor Epitaxial Layers". The gallium arsenide epitaxial layer 12 will typically be from 1 to 5 micrometers in thickness and will have a resistivity on the order of about $10^{-3}$ ohm centimeters. During the epitaxial growth step to form the layer 12, a P-type impurity such as germanium or beryllium is diffused from the substrate 10 into a portion 13 of the epitaxial layer 12 to form the PN junction 14 therein, as indicated by the dotted line in FIG. 2. As compared to the relatively scarce and expensive element gallium required of conventional GaAs substrate starting materials, aluminum is a widely available and inexpensive element. Therefore, the use of aluminum as a principal element of the compound semiconductor substrate (instead of gallium) greatly reduces solar cell processing costs as compared to the costs of those prior art processes which utilize gallium arsenide substrates as a starting material for the process.

The structure in FIG. 2 is then transferred to a conventional ohmic contact deposition station wherein an N-type contact layer 16, such as a gold-germanium-nickel alloy, is evaporated on the exposed surface of the epitaxial layer 12. Finger-like electrodes 18 of P-type metallization, such as a gold-zinc-gold alloy, are then deposited using known and appropriate resist masking techniques to cover only selected areas of the exposed surface of the P-type window layer 10. A suitable anti-reflective (AR) coating 20, such as tantalum oxide, $TA_2O_5$, is deposited as shown in FIG. 3 between the electrode members 18 and typically has an index of refraction of about 2.1. Finally, the structure of FIG. 3 is encapulated in a suitable quartz glass (not shown) and this cover glass will preferably include a coating of magnesium fluoride, $MgF_2$, on the surface thereof to minimize light reflection at the outer surface of the device.

The structure of FIG. 3 may be bonded, as shown in FIG. 4, to a suitable metallic conducting support member 22 such as copper or aluminum, and in actual practice many of these solar cell structures are connected in series and in parallel on a much larger support member (not shown) in the fabrication of large array solar cells operative for the generation of relatively large amounts of electrical power.

Various modifications may be made in the above-described embodiment of the invention without departing from the true scope thereof. For example, the present invention is not limited to the particular aluminum phosphide antimonide and aluminum indium phosphide III-V ternary substrate window materials and may also be fabricated using other aluminum-containing ternary or binary III-IV compounds, such as aluminum arsenide or aluminum phosphide. Additionally, the present invention may be extended to the manufacture of semiconductor devices such as laser diodes and light emitting diodes to which the objects and features herein apply. Also, vapor phase epitaxy (VPE) can be used instead of liquid phase epitaxy in forming the thin GaAs layer 12 previously described.

The following process and materials value are applicable to one process and one device embodiment of the present invention, but should not be deemed as restrictive of the invention as claimed.

EXAMPLE

A substrate of beryllium doped aluminum phosphide antimonide of $AlP_{0.25}Sb_{0.75}$ composition is initially cleaned and polished using standard wafer processing techniques and is then submerged into a saturated solution of gallium arsenide in gallium using the above identified vertical slide bar LPE epitaial deposition techniques of Ser. No. 717,806. The Be doping concentration in the $AlP_{0.25}Sb_{0.75}$ substrate is preferably on the order of about $1 \times 10^{18}$ atoms per cubic centimeter, and the GaAs in GA solution is initially doped with either Te or Sn to a concentration of approximately $10^{17}$ atoms per cubic centimeter or greater. During this LPE growth process, a thin N-type 5 micrometer GaAs epitaxial layer of $10^{-3}$ ohm cm resistivity is grown on the P-type $AlP_{0.25}Sb_{0.75}$ substrate, which substrate has a bandgap of greater than 2.3 electron volts. By reducing the initial solution growth temperature of about 750° C. or greater at a rate of 0.2° C. per minute for about five minutes, a thin N-type GaAs layer of about 5 micrometers can be grown on the Be doped aluminum phosphide antimonide substrate, and the Te or Sn N-type doping of the GaAs in Ga solution provides a PN junction in the thin GaAS epitaxial layer at a depth of between 0.2 and 0.5 micrometers from the substrate -epi layer interface. After the formation of the basic PN junction structure described above, the contacts and coating layers 16, 18 and 20 of FIGS. 3 and 14 are applied to the outer surfaces thereof using standard metallization techniques.

As an alternative to the above aluminum phosphide antimonide substrate in the above example, an aluminum indium phosphide substrate of $Al_{0.40}I_{0.60}P$ composition and with a bandgap of greater than 2 electron volts can be used as the substrate starting material. Additionally, other binary compound substrate starting materials such as aluminum nitride or boron nitride can be substituted for either of the above Al-including ternary compounds without departing from the scope of the present invention. That is, either the Al or B in the last named binary compounds would provide the required P-type substrate conductivity for subsequent conversion to N type by the Sn or Te doping of the GaAs in Ga solution. Furthermore, the use of B and N in addition to Al in the substrate starting material can result in a higher substrate bandgap energy than that of the above ternary compounds. However, good crystal lattice matching should be maintained between the alternative binary compound substrate window material and the GaAs epitaxial layer deposited thereon for optimum solar cell performance. Thus, the universal abundance of B and N makes the above binary compound substrate window materials economically attractive for low cost solar cell fabrication for the same reason that the abundance of Al makes the Al-containing ternary compounds attractive for this manufacture.

What is claimed is:

1. A process for fabricating solar cells comprising:
   (a) providing a substrate material selected from the group of materials consisting of aluminum phosphide antimonide and aluminum indium phosphide,
   (b) depositing a thin layer of N-type gallium arsenide on said substrate, and
   (c) diffusing a P-type impurity from said substrate into said thin gallium arsenide layer to form a PN junction therein, whereby the gallium required to provide a gallium arsenide photovoltaic PN junction layer is minimized, and said substrate exhibits a high bandgap energy suitable for good transmission of sunlight to said gallium arsenide layer, thus enhancing the power conversion efficiency of said solar cell.

2. The process defined in claim 1 wherein said thin layer of N-type gallium arsenide is formed by exposing one surface of said substrate to a saturated solution of gallium arsenide in gallium and maintaining said substrate in said solution for a predetermined time while reducing the temperature thereof at a predetermined controlled rate to thereby control the thickness of said galliium arsenide layer deposited on said substrate.

3. The process defined in claim 1 which further includes providing electrical contacts on both said substrate and on said thin gallium arsenide layer for extracting power from said solar cell upon its receipt of sunlight, and further providing a chosen anti-reflective coating adjacent to electrical contacts on the surface of said substrate, whereby said substrate serves as a high bandgap window layer for receiving sunlight.

* * * * *